United States Patent
Wu

(10) Patent No.: US 9,883,599 B2
(45) Date of Patent: Jan. 30, 2018

(54) MANUFACTURING METHOD FOR MULTI-LAYER CIRCUIT BOARD HAVING CAVITY

(71) Applicant: Chien-Hung Wu, Hsinchu County (TW)

(72) Inventor: Chien-Hung Wu, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 331 days.

(21) Appl. No.: 14/603,363

(22) Filed: Jan. 23, 2015

(65) Prior Publication Data

US 2016/0095231 A1 Mar. 31, 2016

(30) Foreign Application Priority Data

Sep. 29, 2014 (TW) ............................. 103133743 A

(51) Int. Cl.
*H05K 3/46* (2006.01)

(52) U.S. Cl.
CPC ........... *H05K 3/4697* (2013.01); *H05K 3/462* (2013.01); *H05K 3/465* (2013.01); *H05K 3/4614* (2013.01); *H05K 3/4644* (2013.01); *H05K 2203/061* (2013.01); *Y10T 29/4913* (2015.01); *Y10T 29/49126* (2015.01); *Y10T 29/49128* (2015.01)

(58) Field of Classification Search
CPC .... H05K 3/4614; H05K 3/462; H05K 3/4644; H05K 3/465; H05K 3/4697; H03K 2203/061; Y10T 29/49126; Y10T 29/49128; Y10T 29/4913
See application file for complete search history.

(56) References Cited

U.S. PATENT DOCUMENTS

| 6,393,696 B1 * | 5/2002 | Yoon | H05K 3/4697 |
| | | | 257/E23.063 |
| 2011/0042124 A1 * | 2/2011 | Matsui | H05K 3/4697 |
| | | | 174/157 |

FOREIGN PATENT DOCUMENTS

| JP | 2008311508 A | * 12/2008 |
| TW | 201130405 | 9/2011 |
| TW | 1440153 | 6/2014 |

OTHER PUBLICATIONS

"Office Action of Taiwan Counterpart Application", dated May 9, 2016, p. 1-p. 11.

* cited by examiner

*Primary Examiner* — A. Dexter Tugbang
(74) *Attorney, Agent, or Firm* — JCIPRNET

(57) ABSTRACT

A manufacturing method of a multi-layer circuit board having a cavity is provided, including the following steps: a core board is provided, and a through hole is formed penetrating the core board; two build-up structures are bonded to two opposite sides of the core board to form the multi-layer circuit board, and the two build-up structures cover the through hole; and a portion of one of the two build-up structures corresponding to the through hole is removed to make the through hole communicate with the outside and form the cavity. A multi-layer circuit board having a cavity, manufactured by the aforementioned method, is also provided.

11 Claims, 8 Drawing Sheets

MANUFACTURING METHOD FOR MULTI-LAYER CIRCUIT BOARD HAVING CAVITY

CROSS-REFERENCE TO RELATED APPLICATION

This application claims the priority benefit of Taiwan application serial no. 103133743, filed on Sep. 29, 2014. The entirety of the above-mentioned patent application is hereby incorporated by reference herein and made a part of this specification.

BACKGROUND OF THE INVENTION

Field of the Invention

The invention relates to a multi-layer circuit board and a manufacturing method thereof. More particularly, the invention relates to a multi-layer circuit board having a cavity and a manufacturing method thereof.

Description of Related Art

In order to increase the application of printed circuit boards (PCB), a variety of technologies have been developed in recent years to manufacture printed circuit boards having multi-layer circuit structures for increasing the internal space for circuit layout. A manufacturing method of a multi-layer circuit board is to repeatedly stack and laminate a build-up structure, composed of a copper foil and a prepreg (pp), onto a core board to increase the internal layout space of the circuit board and utilize an electroplating process to fill a conductive material in a through hole or a blind hole of each build-up structure for conduction between the layers. In addition, various types of elements, such as chips, connectors, optoelectronic components, or heat dissipation elements, may be disposed in the multi-layer circuit board as required to add functions to the multi-layer circuit board.

To avoid increasing the thickness of the multi-layer circuit board when electronic elements are added, some manufacturing methods may include forming a cavity in the multi-layer circuit board for disposing the electronic elements, so as to embed the electronic elements in the multi-layer circuit board. The conventional methods form the cavity in the multi-layer circuit board by performing laser drilling or CNC drilling after the multi-layer circuit board are formed through repeatedly laminating the build-up structures on the core board. In order to precisely form the cavity having the desired size on the multi-layer circuit board, high-precision instruments are required for depth control during the manufacturing process. In addition, it is difficult to form a straight shape at the junction of the bottom and the sidewall of the cavity, so that undercut may occur and the bottom of the cavity may become uneven easily after being processed. Further, the processing costs increase with the depth of the cavity.

SUMMARY OF THE INVENTION

The invention provides a multi-layer circuit board having a cavity and a manufacturing method thereof, for preventing the cavity from being undercut and for reducing the production costs.

A manufacturing method of a multi-layer circuit board having a cavity according to the invention includes the following steps: providing a core board and forming a through hole penetrating the core board, wherein the core board includes a first dielectric layer and two first conductive layers disposed on two opposite surfaces of the first dielectric layer and conducted with each other; bonding two build-up structures to two opposite sides of the core board to form the multi-layer circuit board, and the two build-up structures cover the through hole, wherein each of the build-up structures includes a stopper layer, at least one second dielectric layer and at least one second conductive layer which are stacked in sequence on the stopper layer, and each of the build-up structures faces the core board with the stopper layer and the stopper layer corresponds to the through hole; and removing a portion of one of the two build-up structures corresponding to the through hole, such that the through hole communicates with the outside to form the cavity.

A multi-layer circuit board having a cavity manufactured by the manufacturing method of the invention includes a core board, two build-up structures, and a cavity. The core board includes a first dielectric layer, two first conductive layers, and a through hole. The two first conductive layers are disposed on two opposite surfaces of the first dielectric layer and are conducted with each other. The through hole penetrates the core board. The two build-up structures are disposed on two opposite sides of the core board, wherein each of the build-up structures includes a stopper layer, at least one second dielectric layer and at least one second conductive layer which are stacked in sequence on the stopper layer. Each of the build-up structures faces the core board with the stopper layer. One of the two build-up structures covers the through hole, and the other one of the two build-up structures exposes the through hole. The cavity is formed by communicating the through hole with the outside, and the cavity is formed in the core board and the other one of the two build-up structures.

Based on the above, according to the multi-layer circuit board having the cavity and the manufacturing method thereof in the invention, the core board is formed with the through hole before the two build-up structures are bonded to the core board. Thereafter, a portion of one of the two build-up structures corresponding to the through hole is removed, so as to make the through hole communicate with the outside to form the cavity. In comparison with the conventional method that forms the cavity directly on the multi-layer circuit board after manufacturing the build-up structures and the core board into the multi-layer circuit board, the manufacturing method of the invention forms the cavity by two steps in the process of manufacturing the multi-layer circuit board, so as to prevent the cavity from being undercut and form a relatively straight sidewall. Therefore, the processing of the manufacturing method of the invention does not require high-precision depth control and can reduce the overall production costs.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

FIG. 1A to FIG. 1H are schematic views illustrating a manufacturing method of a multi-layer circuit board having a cavity according to an embodiment of the invention. With reference to FIG. 1A to FIG. 1H, in this embodiment, a multi-layer circuit board 100 has a cavity 140 for disposing an electronic element (not shown), so as to embed the electronic element in the multi-layer circuit board 100 to add a corresponding function. FIG. 1A to FIG. 1H are schematic cross-sectional views sequentially illustrating steps of the manufacturing method of the multi-layer circuit board 100 having the cavity 140 in this embodiment. The following describes the manufacturing method of the multi-layer circuit board 100 having the cavity 140 in this embodiment in sequence with reference to FIG. 1A to FIG. 1H. Moreover, modification examples of each component are explained with reference to the subsequent figures.

Figure 1A:
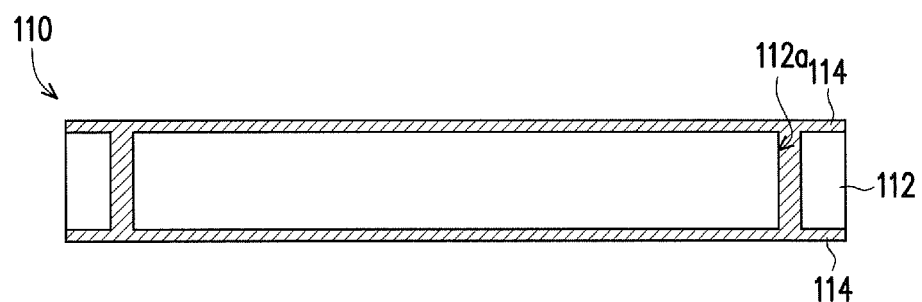
FIG. 1A to FIG. 1H are schematic views illustrating a manufacturing method of a multi-layer circuit board having a cavity according to an embodiment of the invention.

First, in Step S110, a core board 110 is provided. With reference to FIG. 1A, in this embodiment, the core board 110 includes a first dielectric layer 112 and two first conductive layers 114. The two first conductive layers 114 are disposed on two opposite surfaces of the first dielectric layer 112 and are conducted with each other. More specifically, in this embodiment, the two first conductive layers 114 are disposed on two opposite surfaces of the first dielectric layer 112, and the two first conductive layers 114 are conducted with each other by a conductive hole 112a that penetrates the first dielectric layer 112, wherein a material of the first conductive layers 114 includes copper or other suitable conductive materials, for example. Thus, a copper clad laminate (CCL) may be used as the core board 110 of this embodiment directly. However, it should be noted that the invention is not intended to limit the type and composition of the core board 110.

Figure 1B:

Next, in Step S120, a through hole 116 is formed to penetrate the core board 110. With reference to FIG. 1B, in this embodiment, the step of forming the through hole 116 penetrating the core board 110 includes a mechanical drilling process, a mechanical milling process, or a laser drilling process, for example. However, it should be noted that the invention is not intended to limit the method of forming the through hole 116. The processing for forming the through hole 116 in the core board 110 is relatively simple as compared to the processing of forming the cavity on the core board 110. The reason is that the through hole 116 is formed to directly penetrate the core board 110 by mechanical drilling or laser drilling. Therefore, it is not required to perform depth control with use of a high-precision instrument. In other words, the through hole 116 is formed by directly drilling the core board 110 without calculating the depth of processing the core board 110.

Figure 1C:

Then, in Step S130, the two first conductive layers 114 are patterned to form two inner circuits 114a. With reference to FIG. 1C, in this embodiment, after the step of providing the core board 110, the two first conductive layers 114 disposed on two opposite sides of the first dielectric layer 112 are patterned according to a desired circuit layout to form two inner circuits 114a, and the two inner circuits 114a are conducted with each other by the conductive hole 112a. In addition, a method of patterning the two first conductive layers 114 may include performing an etching process or other suitable processes. However, it should be noted that the invention is not intended to limit the method of patterning the two first conductive layers 114. Moreover, in this embodiment, the two first conductive layers 114 are patterned after the formation of the through hole 116, so as to prevent the two inner circuits 114a formed by patterning the two first conductive layers 114 from being damaged during the formation of the through hole 116. Nevertheless, in other embodiments of the invention, the through hole 116 may be formed after the two first conductive layers 114 are patterned. The invention is not intended to limit the sequence of Step S120 and Step S130, which may be varied as required.

Figure 1D:
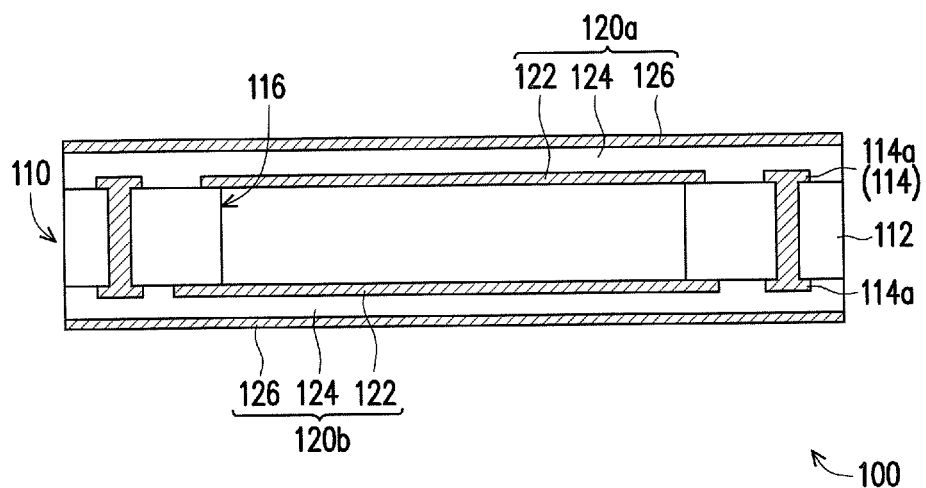

Thereafter, in Step S140, two build-up structures 120a and 120b are respectively bonded to two opposite sides of the core board 110, so as to form the multi-layer circuit board 100. With reference to FIG. 1D, in this embodiment, the two build-up structures 120a and 120b are respectively bonded to two opposite sides of the core board 110, wherein the two build-up structures 120a and 120b cover the through hole 116, and the two build-up structures 120a and 120b cover the two inner circuits 114a correspondingly. More specifically, each of the build-up structures 120a and 120b includes a stopper layer 122, at least one second dielectric layer 124 and at least one second conductive layer 126 which are stacked in sequence on the stopper layer 122. Each of the build-up structures 120a and 120b is bonded to the core board 110 and faces the core board 110 with the stopper layer 122. In this embodiment, each of the build-up structures 120a and 120b includes one second dielectric layer 124 and one second conductive layer 126, for example. However, it should be noted that the invention is not intended to limit the number of the second dielectric layer 124 and the number of the second conductive layers 126.

Furthermore, in this embodiment, the build-up structure 120a that serves as an upper layer includes the stopper layer 122, the second dielectric layer 124, and the second conductive layer 126. A material of the stopper layer 122 and the second conductive layer 126 includes copper or other suitable conductive materials, for example, and the second dielectric layer 124 may be a prepreg (PP). Moreover, in the build-up structure 120a, the area of the second dielectric layer 124 is substantially equal to the area of the second conductive layer 126, and the area of the stopper layer 122 is smaller than the area of the second dielectric layer 124, so as to expose a portion of the second dielectric layer 124. Thus, the build-up structure 120a is pre-bonded to the core board 110 through the second dielectric layer 124 exposed at a side of the stopper layer 122. The pre-bonding means that the build-up structure 120a is temporarily bonded to the core board 110 through the prepreg that serves as the second dielectric layer 124 flows onto the core board 110 and covers the first dielectric layer 112 and the corresponding inner circuit 114a due to a semi-curing characteristic thereof, and a subsequent curing process is required for completely fix the build-up structure 120a to the core board 110. Likewise, the build-up structure 120b that serves as a lower layer has a similar structure and is pre-bonded to the core board 110 through the second dielectric layer 124 exposed at a side of the stopper layer 122.

In addition, in this embodiment, the step of bonding the two build-up structures 120a and 120b to two opposite sides of the core board 110 (Step S140) further includes forming the build-up structures 120a and 120b first. That is to say, layers of the build-up structures 120a and 120b are not disposed sequentially on the core board 110 in this embodiment. Instead, the build-up structures 120a and 120b are first manufactured by stacking the layers and then directly bonded to the core board 110. Accordingly, steps of manufacturing the build-up structures 120a and 120b are illustrated by FIG. 2A to FIG. 2D. Specifically, FIG. 2A to FIG. 2D are schematic views illustrating a manufacturing method of the build-up structures of FIG. 1D. Below, the manufacturing method of the build-up structure 120a is explained with reference to FIG. 1D and FIG. 2A to FIG. 2D.

In this embodiment, the step of forming the build-up structure 120a includes forming two build-up structures 120a simultaneously. By forming two build-up structures 120a in the same process, the production costs are reduced effectively. However, the invention is not limited thereto, and forming two build-up structures 120a simultaneously is merely one of the embodiments of the invention. In other words, the build-up structure 120a may be manufactured solely. The following describes the process of simultaneously forming two build-up structures 120a with reference to FIG. 2A to FIG. 2D. First, with reference to FIG. 2A, in this embodiment, the step of forming two build-up structures 120a simultaneously includes providing two second conductive layers 126 that are bonded to each other. The material of the two second conductive layers 126 includes copper or other suitable conductive materials, for example, and the two second conductive layers 126 are bonded to each other through a release film (not shown) or by local welding. However, it should be noted that the invention is not limited thereto. Next, with reference to FIG. 2B, the step of forming two build-up structures 120a simultaneously further includes respectively bonding two second dielectric layers 124 to the two second conductive layers 126 and respectively bonding two third conductive layers 122a to the two second dielectric layers 124, such that each of the second dielectric layers 124 is located between the corresponding second conductive layer 126 and the corresponding third conductive layer 122a. More specifically, the third conductive layer 122a and the second conductive layer 126 may be made of the same material (e.g., copper) and have substantially the same size. The second dielectric layer 124 may be a prepreg. However, it should be noted that the invention is not intended to limit the materials of the aforementioned components. Thereafter, with reference to FIG. 2C, the step of forming two build-up structures 120a simultaneously further includes patterning the two third conductive layers 122a to form two stopper layers 122 each exposing a portion of the corresponding second dielectric layer 124. In other words, the third conductive layer 122a may be patterned by an etching process or other suitable processes to form the stopper layer 122. In the step of patterning the third conductive layers 122a to form the stopper layers 122, the area of the stopper layer 122 is smaller than the area of the second dielectric layer 124 to expose a portion of the second dielectric layer 124, and the area of the stopper layer 122 is larger than the area of the through hole 116 (as shown in FIG. 1D) so as to cover the through hole 116 after the build-up structure 120a is bonded to the core board 110 in the subsequent process. Accordingly, the two second conductive layers 126, the two second dielectric layers 124, and the two stopper layers 122 constitute the two build-up structures 120a correspondingly. The two build-up structures 120a are still bonded to each other in this step.

Figure 2A:
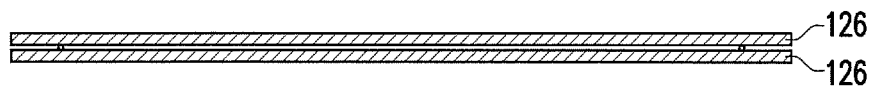
FIG. 2A to FIG. 2D are schematic views illustrating a manufacturing method of a build-up structure of FIG. 1D.
Figure 2B:
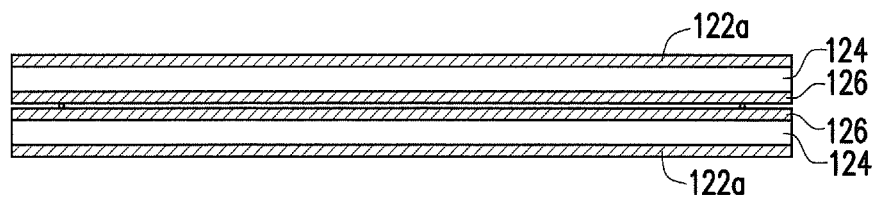
Figure 2C:
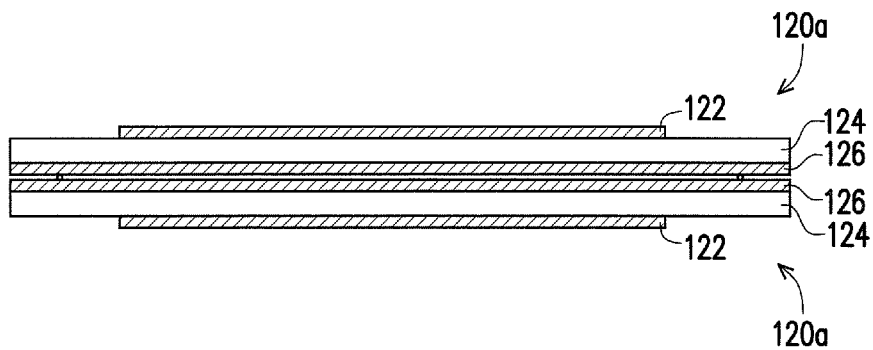
Figure 2D:
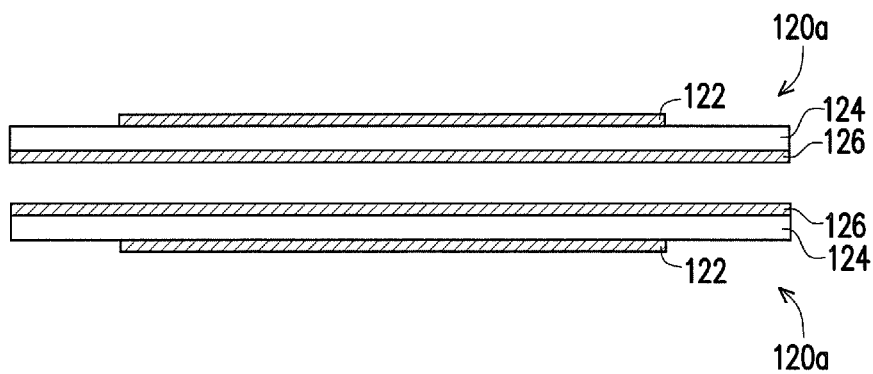

Finally, with reference to FIG. 2D, in this embodiment, the step of simultaneously forming two build-up structures 120a further includes separating the two build-up structures 120a. The step of separating the two build-up structures 120a includes removing the release film or cutting where the two second conductive layers 126 are welded, for example, for separating the two build-up structures 120a. Then, the build-up structure 120a is adapted to be directly bonded to the core board 110 in the aforementioned Step S140, as shown in FIG. 1D. Likewise, the build-up structures 120b that serve as the lower layers may also be manufactured simultaneously by the aforementioned method and then be separated for use. However, the invention is not intended to limit the compositions of the build-up structures 120a and 120b or whether the build-up structures 120a and 120b need to be separated by the aforementioned method after being manufactured simultaneously. That is to say, the build-up structures 120a or 120b bonded to each other may be directly bonded to the core board 110 and then separated from each other after the multi-layer circuit board 100 of FIG. 1D is formed. Please refer to the following for the relevant embodiments.

Figure 3:
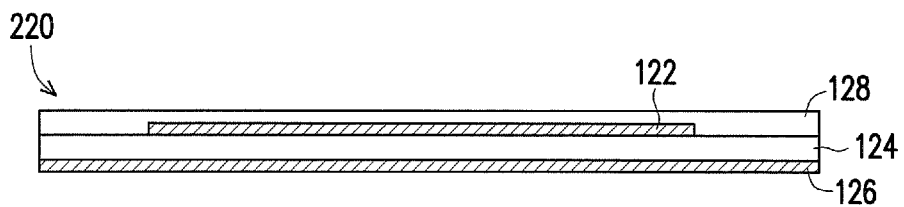
FIG. 3 and FIG. 4 are schematic views illustrating other modification examples of the build-up structure of FIG. 1D.
Figure 4:
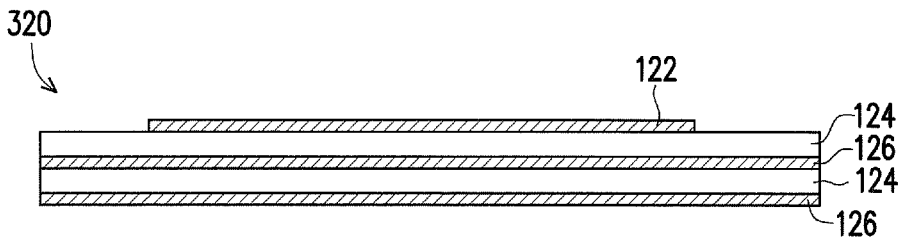

FIG. 3 and FIG. 4 are schematic views illustrating other modification examples of the build-up structure of FIG. 1D. With reference to FIG. 3, as described above, in this embodiment, besides the aforementioned build-up structures 120a and 120b, a build-up structure 220 may serve as the upper layer and/or the lower layer to be bonded to the core board 110 in Step S140. A difference between the build-up structure 220 and the build-up structures 120a and 120b lies in that: the build-up structure 220 includes the stopper layer 122, the second dielectric layer 124, the second conductive layer 126, and the third dielectric layer 128. In contrast to the build-up structures 120a and 120b, the build-up structure 220 includes the additional third dielectric layer 128 because the second dielectric layer 124 of the build-up structure 220 is a cured film. Thus, the build-up structure 220 requires a prepreg disposed on the stopper layer 122 to serve as the third dielectric layer 128, so as to be pre-bonded to the core board 110. Accordingly, the step of forming the build-up structure 220 further includes forming the third dielectric layer 128 on the stopper layer 122. That is, in the manufacturing method of the build-up structure 220, a cured film is used as the second dielectric layer 124 of the build-up structure 220. Thus, in order to bond the manufactured build-up structure 220 to the core board 110, the build-up structure 220 requires a prepreg that serves as the third dielectric layer 128, and the build-up structure 220 is pre-bonded to the core board 110 by the semi-curing characteristic of the prepreg. Furthermore, although FIG. 3 illustrates only one build-up structure 220, two build-up structures 220 may be simultaneously formed by the steps shown in FIG. 2A to FIG. 2C and then separated from each other as shown in FIG. 2D after the formation of the third dielectric layer 128. Hence, in the step of bonding the build-up structure 220 to the core board 110 (Step S140; FIG. 1D), the build-up structure 220 is bonded to the core board 110 through the third dielectric layer 128 with the stopper layer 122 facing the core board 110. Moreover, in the embodiment of FIG. 4, a build-up structure 320 can serve as the upper layer and/or the lower layer to be bonded to the core board 110 in Step S140 of FIG. 1D. A main difference between the build-up structure 320 and the aforementioned build-up structures 120a and 120b lies in that: the build-up structure 320 includes two second dielectric layers 124 and two second conductive layers 126, which are sequentially stacked on the stopper layer 122. In other words, the build-up structure 320 has more layers. It is known from the above that the invention is not intended to limit the number of the layers of the build-up structure, which may be varied as required.

FIG. 5A to FIG. 5E are schematic views illustrating another manufacturing method of the multi-layer circuit board of FIG. 1D. More specifically, in this embodiment, the build-up structure 120a or 120b of FIG. 1D is not necessarily formed by the steps of FIG. 2A to FIG. 2D and then separated to be bonded to the core board 110. The build-up structure 120a or 120b may also be formed by the steps of FIG. 5A to FIG. 5E to be disposed on the core board 110 for manufacturing the multi-layer circuit board 100. The following describes a method of simultaneously manufacturing two multi-layer circuit boards 100 by using two build-up structures 120b with reference to FIG. 5A to FIG. 5E.

Figure 5A:
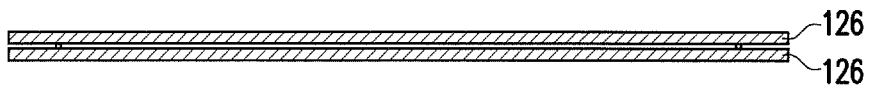
FIG. 5A to FIG. 5E are schematic views illustrating another manufacturing method of the multi-layer circuit board of FIG. 1D.

First, with reference to FIG. 5A, in this embodiment, the step of simultaneously forming two build-up structures 120b includes providing two second conductive layers 126 that are bonded to each other, which is similar to the step of FIG. 2A. Then, with reference to FIG. 5B, the step of simultaneously forming two build-up structures 120b further includes respectively bonding two second dielectric layers 124 to the two second conductive layers 126 and respectively bonding two third conductive layers 122a to the two second dielectric layers 124, such that each second dielectric layer 124 is located between the corresponding second conductive layer 126 and third conductive layer 122a, which is similar to the step of FIG. 2B. Next, with reference to FIG. 5C, the step of simultaneously forming two build-up structures 120b further includes patterning the two third conductive layers 122a to form two stopper layers 122, wherein each of the stopper layers 122 exposes a portion of the corresponding second dielectric layer 124, which is similar to the step of FIG. 2C. Accordingly, the two second conductive layers 126, two second dielectric layers 124, and two stopper layers 122 constitute two build-up structures 120b. The two build-up structures 120b remain bonded to each other so far.

Figure 5B:
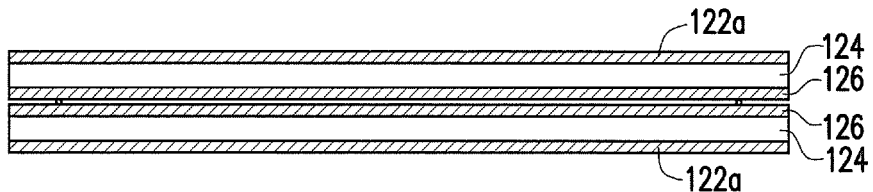
Figure 5C:
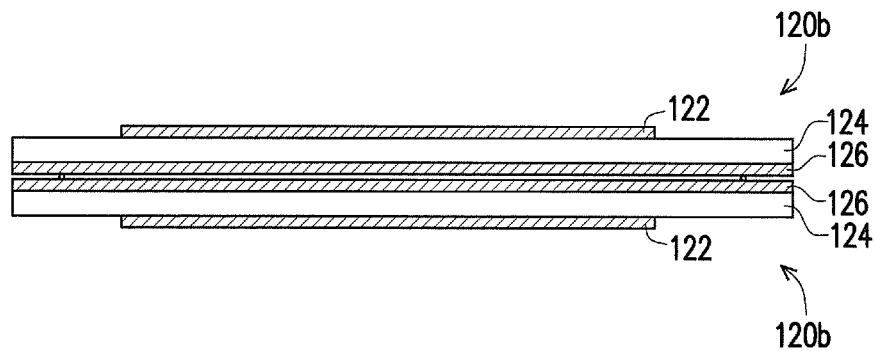
Figure 5D:
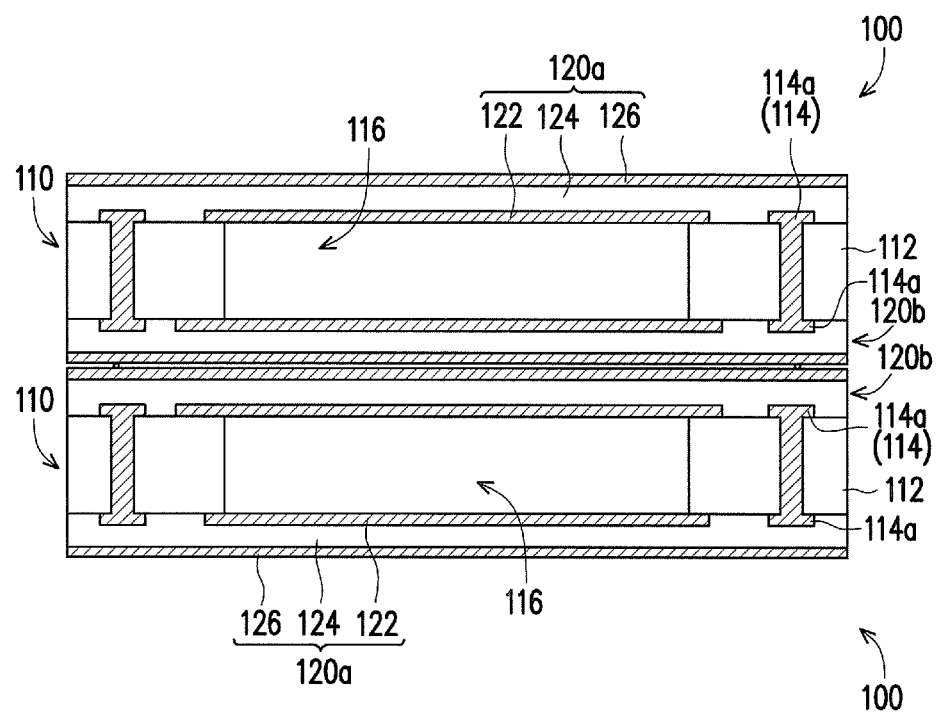
Figure 5E:
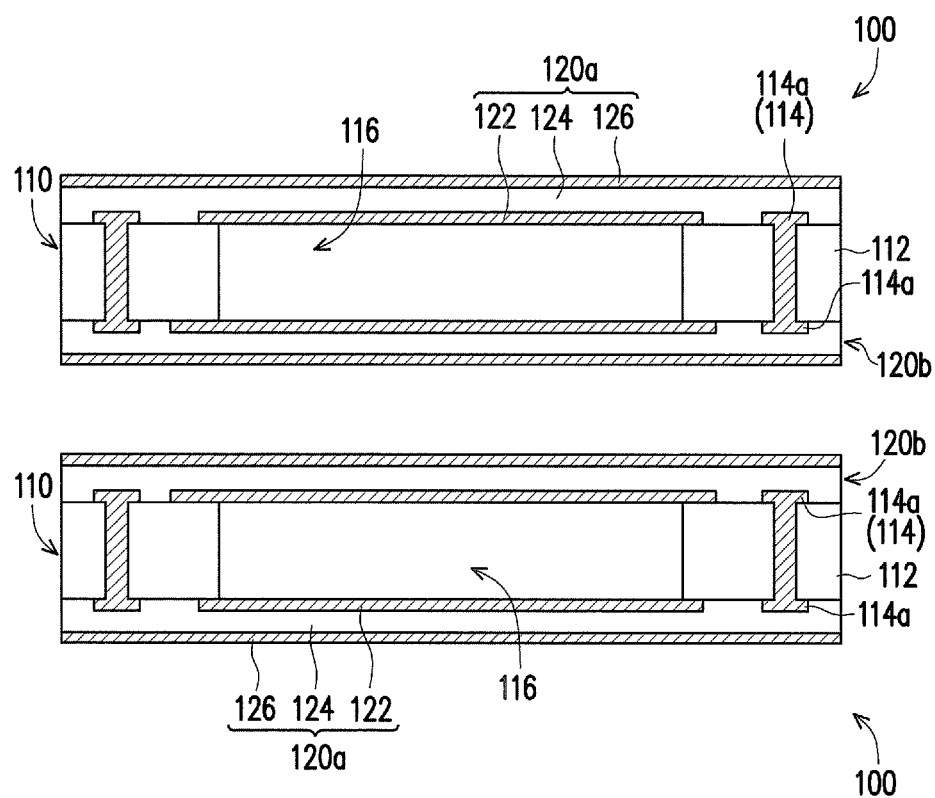

Thereafter, when Step S140 of FIG. 1D is performed on the aforementioned two build-up structures 120b, opposite sides of the two build-up structures 120b bonded to each other are respectively bonded to two core boards 110. In other words, the manufactured two build-up structures 120b that are bonded together are not separated from each other and are directly bonded to two core boards 110 respectively. Then, the required build-up structure 120a is disposed on the other side of each core board 110, so as to form two multi-layer circuit boards 100 as shown in FIG. 1D. In other words, in Step S140 of FIG. 1D, two multi-layer circuit boards 100 may be manufactured at the same time by using two build-up structures 120b that are bonded to each other (that is, simultaneously manufacturing two multi-layer circuit boards 100 of FIG. 1D that are bonded as illustrated in FIG. 5D). The two build-up structures 120b that are simultaneously manufactured by the method of FIG. 5A to FIG. 5C are still bonded to each other so far. The step of FIG. 5D is carried out in such a condition. After the step of FIG. 5D is completed, the two build-up structures 120b are separated as shown in FIG. 5E, wherein a step of separating the two build-up structures 120b for example includes removing the release film or cutting where the two second conductive layers 126 are welded to separate the two build-up structures 120b, so as to form two multi-layer circuit boards 100 as shown in FIG. 1D. Likewise, the build-up structure 120a of FIG. 1D, the build-up structure 220 of FIG. 3, and the build-up structure 320 of FIG. 4 may also be manufactured by the manufacturing method shown in FIG. 5A to FIG. 5E and directly applied to two core boards 110 for simultaneously manufacturing two multi-layer circuit boards 100. Details thereof will not be repeated here.

Again, with reference to FIG. 1D, after totaling and bonding the build-up structure 120a or 120b as shown in FIG. 2D to two opposite sides of the core board 110, or forming the build-up structure 120a or 120b as shown in FIG. 5C, the area of the stopper layer 122 is smaller than the area of the second dielectric layer 124 for exposing a portion of the second dielectric layer 124. Accordingly, the build-up structures 120a and 120b are adapted to be bonded to the core board 110 through the second dielectric layer 124 exposed outside the stopper layer 122. In addition, the area of the stopper layer 122 is larger than the area of the through hole 116, so as to cover the through hole 116. Accordingly, the prepregs that serve as the second dielectric layers 124 in the build-up structures 120a and 120b are prevented from flowing into the through hole 116. Furthermore, after completing Step S140 as shown in FIG. 1D, the prepregs (e.g., the second dielectric layers 124 and the third dielectric layers 128) in the two build-up structures 120a and 120b may be cured by a curing process, so as to fix the two build-up structures 120a and 120b on the core board 110.

Figure 1E:
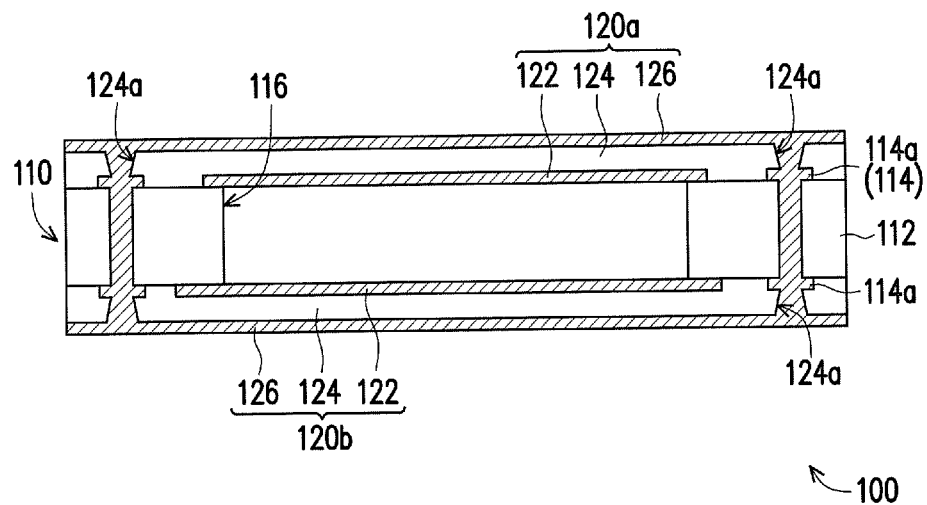

Thereafter, in Step S150, after the step of bonding the two build-up structures 120a and 120b to two opposite sides of the core board 110, the two second conductive layers 126 and the two first conductive layers 114 are conducted. With reference to FIG. 1E, in this embodiment, the step of conducting the two second conductive layers 126 and the two first conductive layers 114 for example includes forming a conductive hole 124a in the second dielectric layer 124 of each of the build-up structures 120a and 120b, wherein the conductive hole 124a is a through hole penetrating the second dielectric layer 124 and is filled with a conductive material for conducting the second conductive layer 126 and the first conductive layer 114 on two opposite sides of the second dielectric layer 124. Moreover, because the two first conductive layers 114 of this embodiment have been patterned to form two inner circuits 114a before bonding of the two build-up structures 120a and 120b, Step S150 is in fact to conduct the two second conductive layers 126 and the two inner circuits 114a.

Figure 1F:
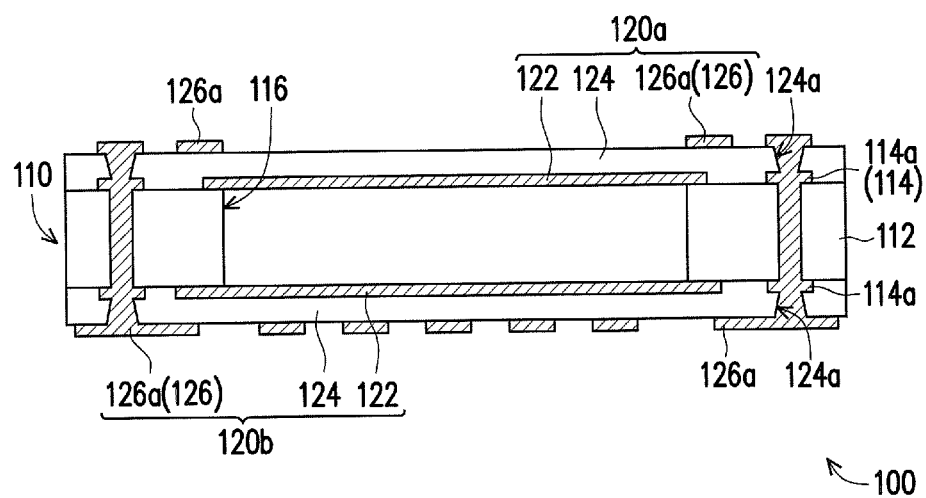

Thereafter, in Step S160, after the step of bonding the two build-up structures 120a and 120b to two opposite sides of the core board 110, the two second conductive layers 126 are patterned to foil 1 two outer circuits 126a. With reference to FIG. 1F, in this embodiment, the step of patterning the two second conductive layers 126 to form the two outer circuits 126a for example includes patterning the two second conductive layers 126 to form the two outer circuits 126a according to a desired circuit pattern by performing an etching process or other suitable processes. Accordingly, the two outer circuits 126a are electrically connected with the two inner circuits 114a through the conductive hole 124a to be conducted with each other. Moreover, in other embodiments, the manufacturing method of the invention may pattern the two second conductive layers 126 to form the two outer circuits 126a first, and then conduct the two second conductive layers 126 (the outer circuits 126a) and the two first conductive layers 114 (inner circuits 114a). That is, the invention is not intended to limit the sequence of performing Step S150 and Step S160, which may be varied as required. Thus, the core board 110 and the two build-up structures 120a and 120b substantially constitute the basic structure of the multi-layer circuit board 100, and the inner circuits 114a and the outer circuits 126a in the core board 110 and the two build-up structures 120a and 120b are conducted with each other.

Figure 1G:
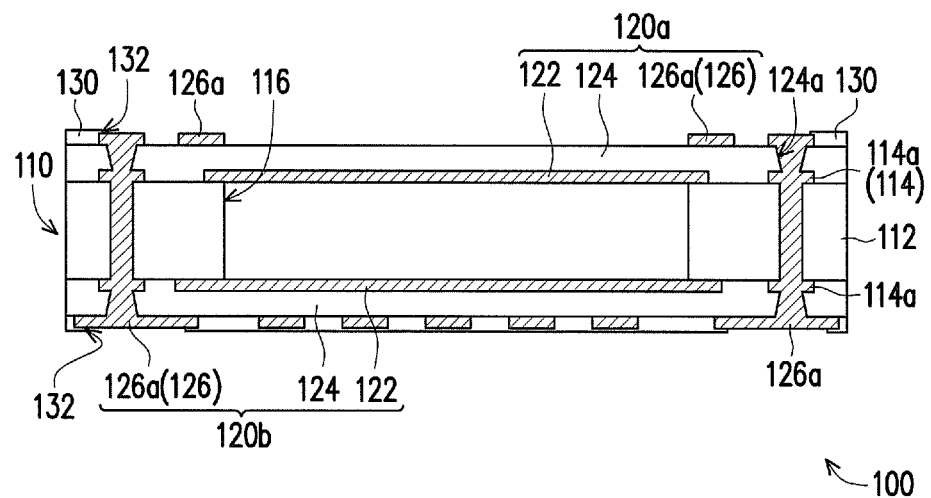

Then, in Step S170, after the step of patterning the two second conductive layers 126 to form the two outer circuits 126a, two solder resist layers 130 are disposed on the two outer circuits 126a. With reference to FIG. 1G, the two solder resist layers 130 are respectively formed on the two outer circuits 126a, wherein the two solder resist layers 130 have a plurality of openings 132, and a portion of the two outer circuits 126a is exposed by the openings 132. More specifically, each solder resist layer 130 covers a major area of the corresponding outer circuit 126a while a partial area of the outer circuit 126a is exposed by the opening 132 to serve as a conductive pad. Thus, each solder resist layer 130 shields the major area of the corresponding outer circuit 126a and other electronic elements (not shown) can be connected with the outer circuits 126a and the inner circuit 114a through the conductive pad exposed by the opening 132 to be electrically connected with the multi-layer circuit board 100. However, in other embodiments, the solder resist layer 130 may be formed in the last step of the manufacturing method of the invention; or alternatively, the solder resist layer 130 may not be formed. The invention is not intended to limit when or whether the solder resist layer 130 is formed, which may be varied as required.

Figure 1H:
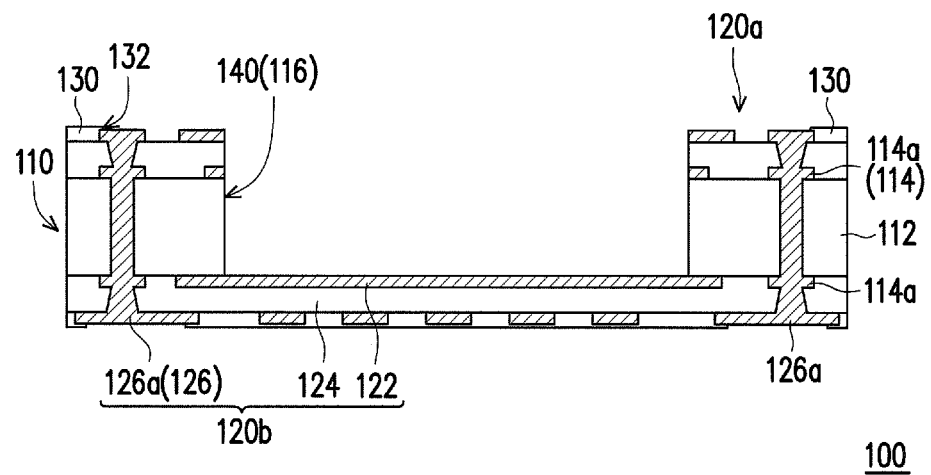

Finally, in Step S180, a portion of one of the two build-up structures 120a and 120b corresponding to the through hole 116 is removed so as to make the through hole 116 communicate with the outside to form the cavity 140. With reference to FIG. 1H, in this embodiment, because the two build-up structures 120a and 120b are bonded to the core board 110 and cover the through hole 116, by removing the portion of one of the two build-up structures 120a and 120b corresponding to the through hole 116 (in this embodiment, a portion of the build-up structure 120a that serves as the upper layer corresponding to the through hole 116 is removed, for example), the through hole 116 covered by the two build-up structures 120a and 120b can communicate with the outside on one side to form the cavity 140. To be more specific, the step of removing the portion of one of the two build-up structures 120a and 120b corresponding to the through hole 116 includes removing the portion by performing a laser drilling process. That is, in this embodiment, the portion of the build-up structure 120a is removed by the laser drilling process, such that the through hole 116 communicates with the outside to form the cavity 140. However, it should be noted that the invention is not limited to using the aforementioned method to remove the portion, which may be varied as required. Moreover, because the build-up structures 120a and 120b of this embodiment use copper as the stopper layer 122, in the process of removing the portion of the build-up structure 120a by the laser drilling process, the processing is stopped when the laser beam reaches the stopper layer 122, made of copper, in the build-up structure 120b. Therefore, the stopper layer 122 of the build-up structure 120b not only prevents the prepreg serving as the second dielectric layer 124 from flowing into the through hole 116 but also serves as a processing stop point of the laser drilling process. Since the portion of the build-up structure 120a corresponding to the through hole 116 is removed to cause the through hole 116 to communicate with the outside and form the cavity 140, the cavity 140 exposes the stopper layer 122 (the processing stop point) of the build-up structure 120b. Accordingly, the multi-layer circuit board 100 having the cavity 140 of this embodiment is completed.

In this embodiment, the multi-layer circuit board 100, manufactured by the manufacturing method as shown in FIG. 1A to FIG. 1H, includes the core board 110, two build-up structures 120a and 120b, two solder resist layers 130, and the cavity 140. The core board 110 includes the first dielectric layer 112, two first conductive layers 114 (inner circuits 114a), and the through hole 116. The two first conductive layers 114 are disposed on two opposite surfaces of the first dielectric layer 112 and are conducted with each other, and the through hole 116 penetrates the core board 110. The build-up structures 120a and 120b are disposed on two opposite sides of the core board 110, wherein each of the build-up structures 120a and 120b includes the stopper layer 122, at least one second dielectric layer 124 and at least one second conductive layer 126 (the outer circuit 126a) which are stacked in sequence on the stopper layer 122. Each of the build-up structures 120a and 120b faces the core board 110 with the stopper layer 122. The two inner circuits 114a and the two outer circuits 114b are conducted with each other. One of the two build-up structures 120a and 120b, e.g., the build-up structure 120b that serves as the lower layer, covers the through hole 116 while the other one of the build-up structures 120a and 120b, e.g., the build-up structure 120a that serve as the upper layer, exposes the through hole 116. The cavity 140 is formed by communicating the through hole 116 with the outside and passes through the core board 110 and the other one of the two build-up structures 120a and 120b (i.e., the build-up structure 120a). Accordingly, the multi-layer circuit board 100 of this embodiment has the cavity 140. Electronic elements (not shown) can be disposed in the cavity 140 to be embedded in the multi-layer circuit board 100 and electrically connected with the outer circuit 126a through the stopper layer 122 or a wire (not shown) to be electrically connected with the multi-layer circuit board 100 for adding corresponding functions to the multi-layer circuit board 100.

It is known from the above that, for the conventional manufacturing method that forms the cavity by directly processing the multi-layer circuit board that has been completed, it is required to simultaneously process at least the build-up structures and the core board, and thus high-precision instruments are needed for performing depth control. In addition, when the processing reaches a certain depth, the cavity may be undercut easily, which causes the sidewall and the bottom of the cavity to be uneven. In contrast thereto, in the embodiment of the invention, the cavity 140 is formed on the core board 110 and the build-up structure 120a that serves as the upper layer by two steps in the manufacturing process of the multi-layer circuit board 100. In the process of forming the through hole 116, because the through hole 116 penetrates through the core board 110, it is not required to use high-precision instruments for depth control. In other words, the through hole 116 is formed by directly drilling through the core board 110 without calculating the processing depth on the core board 110. Thereafter, in the process of removing the portion of the build-up structure 120a that serves as the upper layer corresponding to the through hole 116 to form the through hole 116 into the cavity 140, it is only required to process the portion of the build-up structure 120a corresponding to the through hole 116. Hence, this step does not require high-precision instruments for depth control either, and the stopper layer 122 of the build-up structure 120b that serves as the lower layer can be the processing stop point in this process. In addition, because the cavity 140 of this embodiment is formed by the through hole 116 that penetrates the core board 110 and the removed portion of the build-up structure 120a, the sidewall of the through hole 116 that penetrates the core board 110 is relatively straight, and the bottom of the cavity 140 is formed by bonding the build-up structure 120b that serves as the lower layer after formation of the through hole 116. Therefore, the manufacturing method of this embodiment prevents the cavity 140 from being undercut, and thereby the cavity 140 has the straight sidewall.

To sum up, according to the multi-layer circuit board having the cavity and the manufacturing method thereof in the invention, the through hole has been formed in the core board before the two build-up structures are bonded to the core board. Then, a portion of one of the two build-up structures corresponding to the through hole is removed so as to make the through hole communicate with the outside to form the cavity. In comparison with the conventional method that foil is the cavity directly on the multi-layer circuit board after manufacturing the build-up structures and the core board into the multi-layer circuit board, the manufacturing method of the invention forms the cavity by two steps in the process of manufacturing the multi-layer circuit board, that is, first forming the through hole in the core board and then removing the portion of one of the build-up structures bonded to the core board to form the cavity. Therefore, the invention prevents the cavity from being undercut, and thus the cavity has a relatively straight sidewall. Moreover, in comparison with forming the cavity directly on the multi-layer circuit board, the processing of the manufacturing method of the invention does not require high-precision depth control and thus reduces the overall production costs.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A manufacturing method of a multi-layer circuit board having a cavity, comprising:
   providing a core board and forming a through hole that penetrates the core board, wherein the core board comprises a first dielectric layer and two first conductive layers that are disposed on two opposite surfaces of the first dielectric layer and conducted with each other;
   forming two build-up structures, the step of forming each of the two build-up structures comprises:
      providing at least one second conductive layer;
      bonding at least one second dielectric layer to the at least one second conductive layer, and bonding a third conductive layer to the at least one second dielectric layer; and
      patterning the third conductive layer to form a stopper layer that exposes a portion of the at least one second dielectric layer, wherein the at least one second conductive layer, the at least one second dielectric layer, and the stopper layer constitute each of the two build-up structures;
   bonding the two build-up structures to two opposite sides of the core board and each of the two build-up structures facing the core board with the stopper layer to form the multi-layer circuit board, the two build-up structures cover the through hole and the stopper layer corresponding to the through hole, wherein each of the two build-up structures comprises the stopper layer, the at least one second dielectric layer and the at least one second conductive layer which are stacked in sequence on the stopper layer; and
   removing a portion of one of the two build-up structures corresponding to the through hole, such that the through hole communicates with the removed portion of the one of the two build-up structures outside, to form the cavity.

2. The manufacturing method according to claim 1, wherein the step of forming the through hole that penetrates the core board comprises a mechanical drilling process, a mechanical milling process, or a laser drilling process.

3. The manufacturing method according to claim 1, further comprising:
   patterning the two first conductive layers to form two inner circuits after the step of providing the core board, wherein the two inner circuits are conducted with each other, and the two build-up structures cover the two inner circuits correspondingly.

4. The manufacturing method according to claim 1, wherein in the step of patterning the third conductive layer to form the stopper layer, an area of the stopper layer is smaller than an area of the at least one second dielectric layer to expose a portion of the at least one second dielectric layer, and the area of the stopper layer is larger than an area of the through hole to cover the through hole.

5. The manufacturing method according to claim 1, wherein the step of forming each of the two build-up structures further comprises:
   forming a third dielectric layer on the stopper layer, wherein in the step of bonding the two build-up structures to the two opposite sides of the core board, each of the two build-up structures is bonded to the core board through the third dielectric layer with the stopper layer facing the core board.

6. The manufacturing method according to claim 1, wherein the step of forming each of the two build-up structures further comprises simultaneously forming the two build-up structures, and the step of simultaneously forming the two build-up structures further comprises:
   providing the two second conductive layers that are bonded to each other;
   bonding the two second dielectric layers to the two second conductive layers respectively, and bonding the two third conductive layers to the two second dielectric layers respectively, such that each of the two second dielectric layers is located between the corresponding second conductive layer and third conductive layer; and
   patterning the two third conductive layers to form the two stopper layers, wherein each of the stopper layers exposes a portion of the corresponding second dielectric layer, and the two second conductive layers, the two second dielectric layers, and the two stopper layers constitute the two build-up structures correspondingly.

7. The manufacturing method according to claim 6, wherein the step of simultaneously forming the two build-up structures further comprises:
   separating the two build-up structures to be respectively bonded to the core board.

8. The manufacturing method according to claim 1, further comprising:
   conducting the two second conductive layers and the two first conductive layers after the step of bonding the two build-up structures to the two opposite sides of the core board.

9. The manufacturing method according to claim 1, further comprising:
   patterning the two second conductive layers to form two outer circuits after the step of bonding the two build-up structures to the two opposite sides of the core board.

10. The manufacturing method according to claim 9, further comprising:

forming two solder resist layers on the two outer circuits after the step of patterning the two second conductive layers to form the two outer circuits, wherein the two solder resist layers comprise a plurality of openings, and a portion of the two outer circuits is exposed by the plurality of openings.

11. The manufacturing method according to claim 1, wherein the step of removing the portion of one of the two build-up structures corresponding to the through hole comprises removing the portion of the one of the two build-up structures by the laser drilling process.

* * * * *